(12) United States Patent
Göbl et al.

(10) Patent No.: US 7,884,287 B2
(45) Date of Patent: Feb. 8, 2011

(54) CONNECTING DEVICE FOR ELECTRONIC COMPONENTS

(75) Inventors: Christian Göbl, Nürnberg (DE);
Karlheinz Augustin, Fürth (DE);
Thomas Stockmeier, Erlaugeu (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 912 days.

(21) Appl. No.: 11/732,002

(22) Filed: Apr. 2, 2007

(65) Prior Publication Data

US 2007/0227767 A1    Oct. 4, 2007

(30) Foreign Application Priority Data

Apr. 1, 2006   (DE) .................. 10 2006 015 198

(51) Int. Cl.
*H01R 12/04*   (2006.01)
*H05K 1/16*    (2006.01)

(52) U.S. Cl. ...................... 174/261; 361/803
(58) Field of Classification Search .......... 174/260, 174/261; 361/792–795, 803
See application file for complete search history.

(56) References Cited

U.S. PATENT DOCUMENTS 5,121,299 A * 6/1992 Frankeny et al. ............ 361/785
7,042,074 B2   5/2006 Göbl et al.

FOREIGN PATENT DOCUMENTS

| DE | 102 21 970 | 11/2003 |
| DE | 103 44 121 | 4/2005 |
| DE | 103 55 925 | 6/2005 |
| EP | 1 026 929  | 8/2000 |

* cited by examiner

*Primary Examiner*—Jeremy C Norris
(74) *Attorney, Agent, or Firm*—Cohen Pontani Lieberman & Pavane LLP

(57) ABSTRACT

A connecting device for the electrically conductive connection of electronic components and a substrate. The connecting device is formed as a film composite formed of at least one insulating film and at least two electrically conductive films disposed on opposite sides of the insulating film. The film composite is formed as a layer construction of a conductive film alternating with an insulating film, wherein at least one conductive film is structured and thus forms conductor tracks. Furthermore, at least one conductive film of a main area of the film composite is made of a first metal and has at least one film section having a layer of a second metal that is thinner in comparison with the thickness of the first layer.

18 Claims, 2 Drawing Sheets

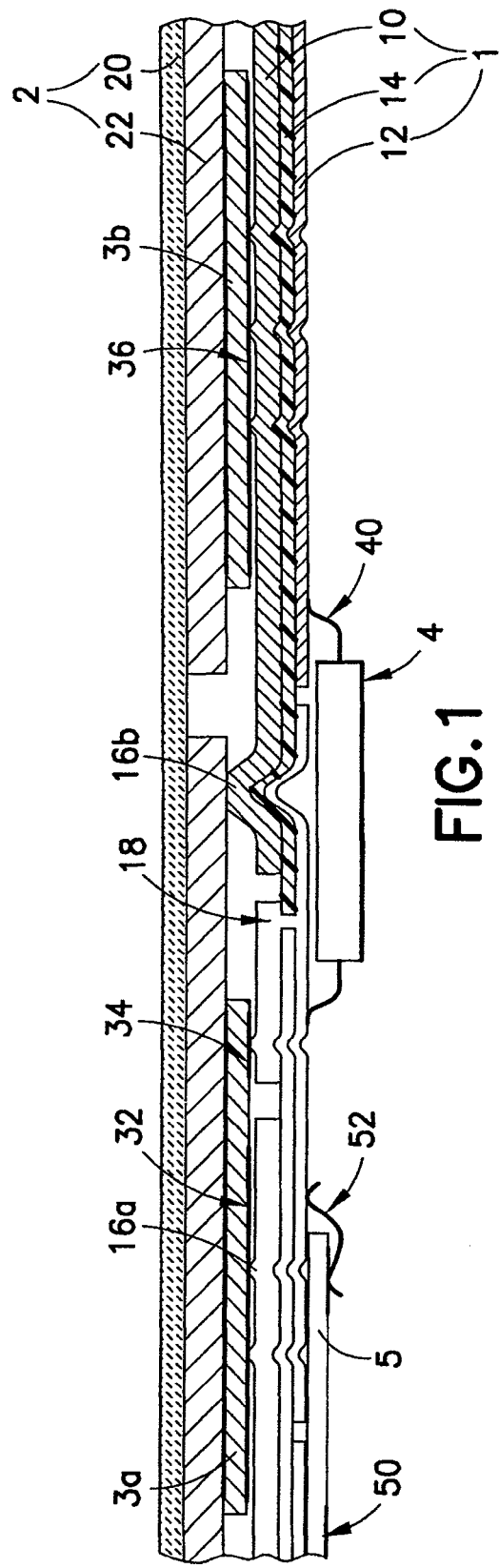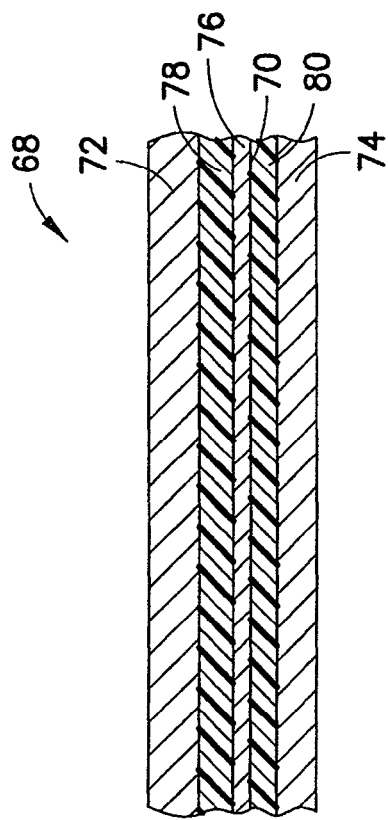

CONNECTING DEVICE FOR ELECTRONIC COMPONENTS

BACKGROUND OF THE INVENTION

1. Field of the Invention

The invention is directed to the field of connecting device for the electrically conductive connection of electronic components and at least one substrate, and, in particular, to such a connecting device formed as a film composite.

2. Description of the Related Art

Many connecting devices for electronic components are known. In the case of packaged components, by way of example, metallic connecting devices and the connection thereof to substrates by soldering are known. "Substrates" in this context are also to be understood to include printed circuit boards.

The use of wire bonding connections is widespread as a connecting device in the case of unpackaged components. Positively locking connections are also utilized, as so-called pressure contact-connections, in the area of power semiconductor modules. Likewise from power semiconductor modules, pressure-contact-connected flexible printed circuit boards are known connecting devices. German Patent Application No. DE 102 21 970 A1 discloses a power semiconductor module comprising a connecting device of this type, but does not disclose the exact structure thereof.

German Patent Application No. DE 103 55 925 A1 discloses a connecting device for power semiconductor components comprising a film composite of a first and a second electrically conductive film with an insulating interlayer therebetween. The power semiconductor components are permanently securely electrically connected to the first conductive layer by ultrasonic welding. In that case, the module-internal circuitry-conforming connection of the power semiconductor components to conductor tracks of a substrate is formed by means of metallic contacts whose thickness is adapted to that of the power semiconductor components. These contacts are connected to the connecting device by ultrasonic welding in the same way as are the power semiconductor components.

In that case, the conductive film for the ultrasonic welding connection to power semiconductor component and contact elements preferably comprises aluminum with embossing bumps, since aluminum forms an excellent welding connection with the metallization of the power semiconductor component. The metallization likewise comprises a final layer of aluminum.

What is disadvantageous in such arrangements, however, is that soldering connections with the aluminum layer are not possible, or are possible only to a very limited extent. Forming the corresponding layer of copper, which has a higher specific conductivity and is solderable, is not disclosed in the art, since a copper layer is not suitable for a welding connection to power semiconductor components.

SUMMARY OF THE INVENTION

It is therefore an object of the invention to provide a connecting device for electronic components, such as, for example, unpackaged power semiconductor components and/or packaged or unpackaged integrated circuits, which is amenable both to a welding connection and to a soldering connection, and which connects a plurality of components in a simple, rapidly producible and flexible manner.

Briefly stated, the invention is based on, but not restricted to, the requirements of an intelligent power semiconductor module having a plurality of components that are to be arranged differently and connected in circuitry-conforming fashion. In a power semiconductor module of this type, unpackaged power semiconductor components are connected to one another and/or to conductor tracks of a substrate on which they are arranged. Additionally, control and auxiliary connections have to be connected to driver components and further electronic components which are arranged either in packaged fashion or in unpackaged fashion in the power semiconductor module. Furthermore, by way of example, sensors for temperature and/or current measurement are to be connected to assigned evaluation units. The external connections of the load connections and of all the required control and auxiliary connections of the power semiconductor components as well as of the driver components are likewise to be connected.

A connecting device according to the invention is configured as a film composite formed of at least one insulating film and two electrically conductive films. This film composite has a layered construction beginning with a conductive film and then alternating an insulating film and a conductive film. At least one conductive film is inherently structured and thus forms conductor tracks that are electrically insulated from one another.

At least one conductive film which is made of a first metallic material and which is arranged on a main area of the film composite has at least one film section, wherein a layer of a second metallic material is arranged on that film section. According to the invention, the layer thickness of the layer formed of the second metallic material is thinner in comparison with the layer thickness of the film composed of the first metallic material.

Particularly preferred developments of this connecting device are mentioned in the respective description of the exemplary embodiments. The inventive solution is additionally explained in more detail on the basis of the exemplary embodiments of FIGS. 1 to 3.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, like reference numerals denote similar elements.

FIG. 1 is a cross-section of a first embodiment of a connecting device in accordance with the invention, arranged with a substrate and components.

FIG. 4 shows a detail of a still further, five-layer, embodiment of a connecting device according to the invention, with only the relevant layers illustrated for clarity.

DETAILED DESCRIPTION OF THE PRESENTLY PREFERRED EMBODIMENTS

Figure 2:
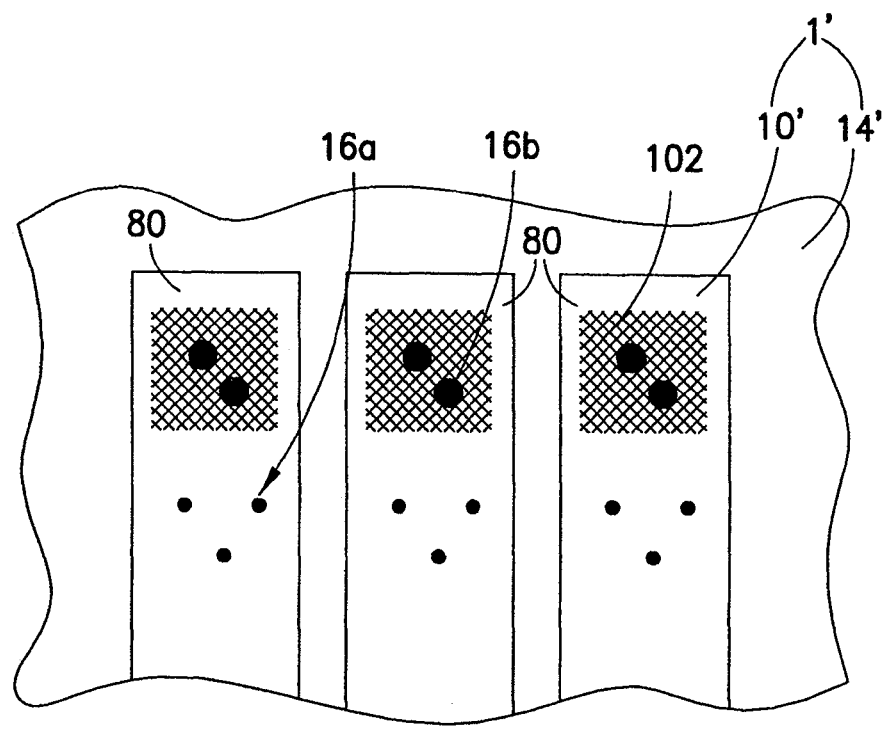
FIG. 2 is a top plan view of a second embodiment of a connecting device in accordance with the invention showing a detail of the first main area thereof.

FIG. 1 shows a first connecting device 1 according to the invention in the arrangement with a substrate 2 and components 3 a/b, 4, 5 shown in cross section. Substrate 2 has conductor track 22 thereon. Conductor tracks 22 are electrically insulated from one another on the side of substrate 2 that faces connecting device 1. Substrates 2 of this type are formed for use in power semiconductor modules, preferably as so-called DCB (direct copper bonding) substrates with metallic conductor tracks 22 formed of copper on a ceramic carrier 20. Any other substrates that form conductor tracks 22 that are electrically insulated from one another are likewise suitable, in which case conductor tracks 22 need not be formed over the whole area below the components arranged on substrate 2, as illustrated. However, this formation is preferred if heat has to be dissipated from the component.

Components 3 a/b are arranged on conductor tracks 22 of substrate 2. The illustrated components may include, by way of example and not limitation, a power diode 3b and a power transistor 3a. These power semiconductor components 3 a/b have at least one contact area 32, 34, 36 on their side facing connecting device 1. By way of example, and not limitation, where component 3a is a power transistor, contact area 32 may be its emitter, and contact area 34 may be its base. Where component 3b is a power diode, contact area 36 may be its anode. For other types of components, the respective contact areas may have other functions, suitable for such components. In accordance with the prior art, contact areas 32, 34, 36 are preferably formed as an aluminum layer.

In a first configuration, connecting device 1 is formed as a film composite that includes a first metallic film 10, here aluminum having a layer thickness of between 50 and 400 μm; an adjoining plastic film 14 having a layer thickness of between about 10 and about 80 μm; and a second metallic film 12, here copper, having a layer thickness of between about 20 and about 100 μm, first film 10 having at least twice the thickness of second film 12.

For the electrically conductive connection of first metallic film 10 to contact areas 32, 34, 36, connecting device 1 has first embossing bumps 16a. Embossing bumps 16a are preferably connected to one of contact areas 32, 34, 36 by ultrasonic welding.

For the electrically conductive connection of first metallic film 10 to conductor tracks, connecting device 1 also has second embossing bumps 16b formed with greater depth. In the region of second embossing bumps 16b, a layer composed of copper having a preferred thickness of between about 1 and about 20 μm is deposited on (aluminum) first metallic film 10. In this case, it is preferred for the deposition to be carried out by a galvanic method or by means of cold gas spraying. Preferably, the copper surface of second embossing bumps 16b is soldered to copper conductor track 22 of substrate 2.

Plastic film 14 has cutouts for plated-through holes 18 between first and second conductive layers 10, 12. Potentials of the first layer are thereby applied to the second layer. This is illustrated, by way of example, for the gate potential of power transistor 3a.

Two integrated circuits 4, 5 are arranged here by way of example on second metallic film 12. It may be preferred to employ further components, such as individual resistors, capacitors, coils or sensors. In further configurations, components of this type may also be arranged on conductor tracks 22 and connected in circuitry-conforming fashion. FIG. 1 shows a first integrated circuit 4, in the form of an SMD component with contacts 40 soldered to assigned conductor tracks of second film 12. A second integrated circuit 5 is illustrated as an unpackaged component and is adhesively bonded to second conductive layer 12. The electrical connection is formed as a thin wire bonding connection 52 of individual contact areas 50 of the component 5 to assigned conductor tracks of second layer 12.

It may also be preferred to arrange a second metallic layer formed of gold on the sections of the conductor tracks which are connected to bonding wires 52.

External connections, by way of example screw connections, of connecting device 1 may be formed as round cutouts of the entire film composite. In this case, it is preferred to arrange a second metallic layer concentrically around the cutouts on at least one conductive film layer of a main area. In this embodiment, it is preferred for the layer to have a thickness of at least about 100 μm and to be deposited by cold gas spraying.

In a further embodiment, which is not explicitly illustrated, connecting device 1 comprises a first metallic film, such as a layer of copper having a thickness of between about 30 and about 300 μm, an adjoining plastic film having a layer thickness of between about 10 and about 80 μm and a second metallic film, likewise composed of a layer of copper having a thickness of between about 30 and about 300 μm.

In this embodiment, the sections of the first layer which provide welding connection to the contact areas of the power semiconductor components are formed with a second layer composed of aluminum. In this fashion, the connection is both desirable and permanent. In this embodiment, the embossing bumps for the connection to the conductor tracks of the substrate by means of soldering technology do not require a second metallic layer.

Figure 3:
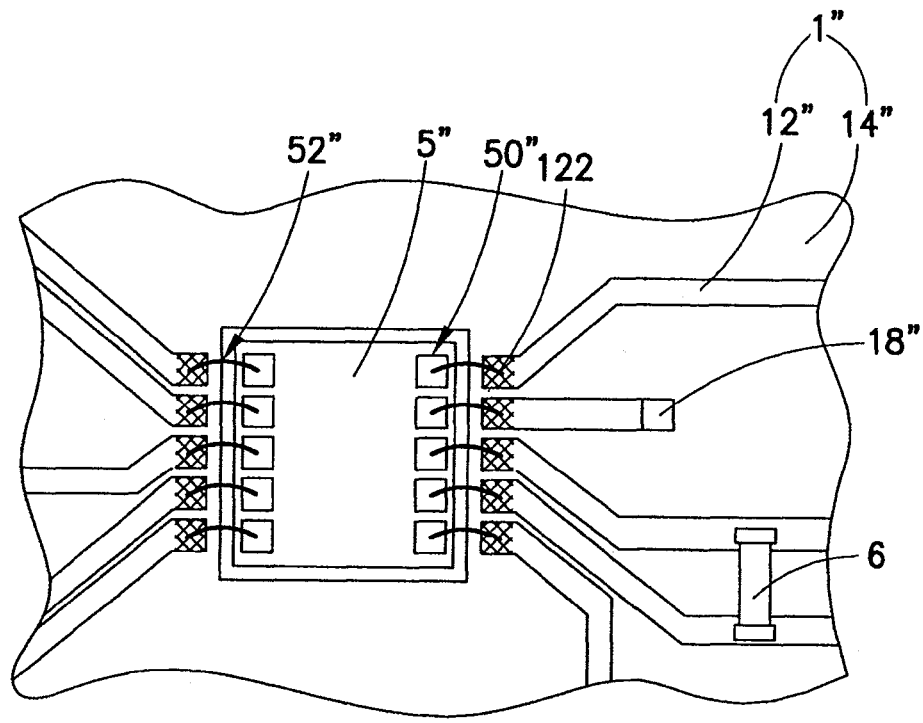
FIG. 3 shows a further embodiment of a connecting device according to the invention in an arrangement with an unpackaged component in a plan view showing a detail of the second main area thereof.

The three-layered construction described here is likewise shown in FIGS. 2-4.

Further embodiments of the inventive connecting device have, by way of example, metallic layers composed of identical metals having the same layer thickness. According to the invention, it may likewise be advantageous to form a layer composite 68 of five layers (FIG. 4), wherein a central metallic layer 70 is preferably formed in particularly thin fashion, compared to outer metallic layers 72, 74, as a screening plane, and is maintained at a defined potential during operation by a connection 76. Alternating insulating layers 78, 80 lie between adjacent pairs of metallic layers, 70 and 72 or 70 and 74, respectively, to form five-layer composite 68.

FIG. 2 shows the film composite of a second embodiment of the inventive connecting device 1' in a plan view of the first main area there of. FIG. 2 shows an insulating layer 14' formed as a plastic film and, in a first formation of the film composite, a first conductive layer 10' composed of aluminum. Aluminum layer 10' is inherently structured and, in this embodiment, forms three conductor tracks 80 that are electrically insulated from one another. Each of these conductor tracks 80 has two groups of embossing bumps 16' a/b for ultrasonic welding connection of unpackaged semiconductor components, here power diodes, or for soldering to conductor tracks of a substrate. Alternative embodiments of this structure are suitable for connecting many types of different unpackaged components to the substrate, not merely power semiconductor components.

In the embodiment shown in FIG. 2, the first group of embossing bumps 16a' is suitable for spot welding components to contact areas which are preferably formed from aluminum. In the section of the second group of embossing bumps 16b', the aluminum layer is arranged with a thinner layer 102 of copper deposited by electrodeposition or by cold gas spraying. Copper layer 102 is particularly suitable for a soldering connection to a conductor track of the substrate.

In a further embodiment (not illustrated), the second conductive layer is formed of copper. This is particularly preferred since copper has a high thermal conductivity for transferring heat from the components and also a low resistively, yielding a high current-carrying capacity. In this case, it is necessary to form the group of embossing bumps for the spot welding connection to components with a second layer formed of aluminum in order to provide a suitable surface for the weld.

FIG. 3 shows another connecting device 1" according to the invention in an arrangement with an unpackaged component 5" arranged thereon, in a plan view of the second main area. The illustration shows an insulating layer 14" formed of a plastic film and a second conductive layer 12" formed of copper. Copper layer 12" is inherently more finely structured in comparison with the first metallic layer (10', shown in FIG. 2) and in this detail forms an area for the adhesive-bonding connection of component 5", here a driver circuit for driving power semiconductor components. Copper layer 12" furthermore forms a multiplicity of conductor tracks for connecting to the driver circuit. The conductor tracks are in turn electrically insulated from one another and have further contact areas for further components, as shown here by way of example in the form of a capacitor 6. The conductor tracks furthermore have sections which are provided with a further metallic layer 122, here formed of a gold layer having a thickness of between about 0.5 and about 5 µm. These sections with a gold coating are the preferred contact areas for the thin wire bonding connection 52" of the contact areas 50" of driver circuit 5" to the conductor tracks. A plated-through hole 18" to the first conductive layer of the film composite is likewise illustrated.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A connecting device for electrically conductively connecting electronic components and at least one substrate, wherein the connecting device comprises:
   a first electrically conductive film, said first electrically conductive film being formed of a first metal, and having a first thickness;
   a second electrically conductive film, said second electrically conductive film being formed of a second metal, and having a second thickness, said first and second thicknesses being not substantially the same; and
   a first insulating film disposed between said first and second electrically conductive films;
   said first and second electrically conductive films and said first insulating film together forming a film composite, said film composite having at least one embossing bump;
   wherein at least one of said first and second electrically conductive films is structured and thereby forms at least one conductor track; and
   wherein said at least one conductor track is soldered to said at least one embossing bump.

2. The connecting device of claim 1,
   wherein said insulating film has at least one cutout for permitting the electrically conductive connection of adjacent conductive films.

3. The connecting device of claim 1,
   wherein an unpackaged power semiconductor component is spot welded to at least one of said embossing bumps on a first main area thereof.

4. The Connecting device according to claim 1,
   wherein said embossing bump is disposed in a film section having a layer of said second metal.

5. The connecting device of claim 4,
   wherein an unpackaged power semiconductor component is spot welded to at least one of said embossing bumps on a first main area thereof.

6. The connecting device of claim 1,
   wherein unpackaged components are attached to a second main area of said film composite by at least one of soldering and adhesive bonding.

7. The connecting device of claim 1,
   wherein packaged components are attached to a second main area of said film composite by at least one of soldering and adhesive bonding.

8. The connecting device of claim 7,
   wherein said unpackaged components are electrically conductively connected to said at least conductor track by at least one thin wire bonding connection.

9. The connecting device of claim 1,
   wherein said second electrically conductive film is formed by cold gas spraying.

10. The connecting device of claim 1,
    wherein said second electrically conductive film is formed by electrodeposition.

11. The connecting device of claim 1,
    wherein said first and second metals are different.

12. The connecting device of claim 11,
    wherein said first metal is aluminum, and said second metal is copper.

13. The connecting device of claim 1,
    wherein said first thickness is between about 50 µm and about 400 µm.

14. The connecting device of claim 13,
    wherein said second thickness is between about 20 µm and about 100 µm.

15. The connecting device of claim 1,
    wherein said first thickness is at least about twice as great as said second thickness.

16. The connecting device of claim 1, further comprising:
    a third electrically conductive film; and
    a second insulating film;
    wherein said first, second and third electrically conducting films and said first and second insulating films together form said film composite;
    wherein said second insulating film is disposed between said second and third electrically conducting films, forming thereby alternating layers of electrically conducting film and insulating film in said film composite.

17. The connecting device of claim 16,
wherein said third electrically conductive film has a third thickness, greater than said second thickness.

18. The connecting device of claim 16, wherein said second electrically conductive film includes a connection for receiving a pre-defined potential during operation of said connecting device, to maintain said second electrically conductive film at said pre-defined potential.

* * * * *